(12) United States Patent
Kim et al.

(10) Patent No.: US 11,458,704 B2
(45) Date of Patent: Oct. 4, 2022

(54) CARRIER FILM FOR TRANSFERRING MICROELEMENT

(71) Applicant: CENTER FOR ADVANCED META-MATERIALS, Daejeon (KR)

(72) Inventors: Kwangseop Kim, Daejeon (KR); Chan Kim, Daejeon (KR); Min Ah Yoon, Daejeon (KR); Jae Hyun Kim, Daejeon (KR); Hyun June Jung, Daejeon (KR); Hak Joo Lee, Daejeon (KR)

(73) Assignee: CENTER FOR ADVANCED META-MATERIALS, Daejeon (KR)

( * ) Notice: Subject to any disclaimer, the term of this patent is extended or adjusted under 35 U.S.C. 154(b) by 190 days.

(21) Appl. No.: 16/766,744

(22) PCT Filed: Nov. 29, 2018

(86) PCT No.: PCT/KR2018/014936
§ 371 (c)(1),
(2) Date: May 25, 2020

(87) PCT Pub. No.: WO2019/107960
PCT Pub. Date: Jun. 6, 2019

(65) Prior Publication Data
US 2020/0398526 A1 Dec. 24, 2020

(30) Foreign Application Priority Data
Nov. 29, 2017 (KR) .................. 10-2017-0161923

(51) Int. Cl.
*B32B 7/022* (2019.01)
*B32B 3/10* (2006.01)
(Continued)

(52) U.S. Cl.
CPC ............... *B32B 7/022* (2019.01); *B32B 3/10* (2013.01); *B32B 7/12* (2013.01); *C09J 7/20* (2018.01);
(Continued)

(58) Field of Classification Search
CPC .. B32B 7/022; B32B 3/10; B32B 7/12; H01L 21/6835; C09J 7/26; C09J 7/29; C09J 2301/18; Y10T 428/28
See application file for complete search history.

(56) References Cited

FOREIGN PATENT DOCUMENTS

| JP | 10-181235 A | 7/1998 |
|---|---|---|
| JP | 2008-018728 A | 1/2008 |

(Continued)

OTHER PUBLICATIONS

Translation of KR101104923. (Year: 2012).*
International Search Report for PCT/KR2018/014936 dated Apr. 1, 2019 from Korean Intellectual Property Office.

*Primary Examiner* — Catherine A. Simone
(74) *Attorney, Agent, or Firm* — Revolution IP, PLLC

(57) ABSTRACT

The present invention relates to a carrier film for transferring a microelement, wherein, when a microelement is pressurized, a uniform pressurizing force is provided to the entire microelement, and a damage to the microelement can be prevented. The carrier film for transferring a microelement comprises: a load control layer having a first elastic modulus and having a space formed in a part of the interior thereof; and an adhesive layer having a second elastic modulus that is smaller than the first elastic modulus, the adhesive layer being provided on the upper portion of the load control layer and configured such that a microelement supposed to be transferred to a target substrate is attached thereto. The load
(Continued)

control layer has a first zero-rigidity area that maintains a first stress in a first deformation range from a first strain to a second strain.

14 Claims, 8 Drawing Sheets

(51) Int. Cl.
*B32B 7/12* (2006.01)
*H01L 21/683* (2006.01)
*C09J 7/20* (2018.01)

(52) U.S. Cl.
CPC ......... *H01L 21/6835* (2013.01); *Y10T 428/28* (2015.01)

(56) References Cited

FOREIGN PATENT DOCUMENTS

| KR | 10-1104923 B1 | 1/2012 |
| KR | 10-2013-0060108 A | 6/2013 |
| KR | 10-2013-0117189 A | 10/2013 |

\* cited by examiner

B-B section (a)

(a)　　　(b)　　　(c)

(a)　　　(b)　　　(c)

CARRIER FILM FOR TRANSFERRING MICROELEMENT

TECHNICAL FIELD

The present invention relates to a carrier film for transferring micro-devices, and, more particularly, to a carrier film for transferring micro-devices, which allows pressing force to be uniformly applied to the entirety of a micro-device upon pressing the micro-device, thereby preventing damage to the micro-device.

BACKGROUND ART

Recently, importance of micro/nano technologies is increasing with the development of electronic products. Most electronic products incorporating micro/nano technologies are provided therein with thin film devices. It is well known in the art that lithography technology for manufacturing such a thin film device is also a very active research field.

Production equipment used in semiconductor processes, flexible electronics processes, display processes, MEMS processes, LED processes, solar cell processes, and the like requires an apparatus for transferring such a thin film device. A thin film device used in flexible electronic products is required to have a very small thickness to be flexibly bent. In general, it is known that a monocrystalline silicon thin film device is required to have a thickness of 5 µm or less to be bent to a curvature of 0.5 mm diameter when assumed to have a fracture strain of 1%.

For typical thick devices, a transfer process including picking and placing is performed using vacuum chuck technology. However, when applied to thin devices, the vacuum chuck technology has a problem in that the devices can be damaged due to pressure generated by a vacuum chuck. As a result, the vacuum chuck technology is generally not applicable to thin film devices having a thickness of 5 µm or less.

In addition, there is a method of transferring devices using an electrostatic chuck. However, when applied to a thin device, this method has a problem in that the device can be damaged due to static electricity.

For the above reasons, there has been proposed a technology of attaching or transferring a thin film device having a very small thickness using van der Waals force acting on a nanoscale. Such a thin film device can be transferred using a transfer apparatus capable of controlling van der Waals force. However, when such a transfer apparatus has a very hard surface, the transfer apparatus cannot be brought into good contact with the thin film device due to a slight thickness difference between devices, a curvature of a substrate, and the like, making it impossible to achieve attachment and transfer of the thin film device. Therefore, a transfer apparatus manufactured using a material having a very low elastic modulus, for example, a polymer or a rubber, is used to transfer such a thin film device. One example of such a transfer apparatus is a flexible stamp.

FIG. 1 is a schematic view of a typical roll-type transfer apparatus and FIG. 2 is a sectional view taken along line A-A of FIG. 1.

First, referring to FIG. 1 and FIG. 2, the roll-type transfer apparatus includes a roller 11 disposed above a target substrate 10. The roller 11 is provided on an outer surface thereof with a flexible adhesive layer 12 adapted to attach a micro-device 13 thereto. Upon rotation of the roller 11, the micro-device 13 attached to the adhesive layer 12 is transferred to the target substrate 10 while being pressed between the roller and the target substrate 10.

In order to stably transfer the micro-device 13 to the target substrate 10, the adhesive layer 12 is required to be parallel to the target substrate 10. In this way, uniform pressing force can be applied to the micro-device 13 during the transfer process. However, in the roll-type transfer apparatus, uniform pressing force cannot be applied to the micro-device 13 due to machining errors of the roller 11, assembly errors between various components including the roller 11, load control errors occurring in the process of controlling pressing force applied to the micro-device 13, and the like. As a result, a portion of the micro-device 13 to which a smaller pressure is applied cannot be properly transferred, whereas a portion of the micro-device 13 to which a larger pressure is applied can be squashed and damaged.

Moreover, since the adhesive layer 12 generally has a small elastic modulus, the adhesive layer undergoes tensile strain in a circumferential direction of the roller 11 when compressed between the roller 11 and the target substrate 10. Then, the tensile strain is transmitted to the micro-device 13 attached to the adhesive layer 12, thereby causing damage to the micro-device 13, such as tearing or stretching.

This problem can also occur in a plate-type transfer apparatus.

FIG. 3 is a schematic view of a typical plate-type transfer apparatus, and FIG. 4 is a sectional view taken along line B-B of FIG. 3.

Referring to FIG. 3 and FIG. 4, when a micro-device 23 attached to an adhesive layer 22 formed on a lower surface of a pressure plate 21 disposed above a target substrate 20 is pressed against the target substrate 20, it is difficult to apply uniform pressure to the entire micro-device 23 due to various errors as described above. Accordingly, it is difficult to stably transfer the micro-device 23 to the target substrate 20.

Moreover, when the adhesive layer 22 is compressed between the pressure plate 21 and the target substrate 20, the adhesive layer 22 can undergo horizontal tensile strain, thereby causing damage to the micro-device 23.

Therefore, there is a need for technology which can prevent non-uniformity in pressing force due to various errors, thereby allowing uniform pressing force to be applied to the entirety of a micro-device upon transferring the micro-device to a target substrate while preventing damage to the micro-device.

DISCLOSURE

Technical Problem

It is an aspect of the present invention to provide a carrier film for transferring micro-devices, which allows pressing force to be uniformly applied to the entirety of a micro-device upon pressing the micro-device, thereby preventing damage to the micro-device.

Technical Solution

In accordance with one aspect of the present invention, a carrier film for transferring micro-devices includes: a load control layer having a first elastic modulus and having a space partially formed therein; and an adhesive layer formed on the load control layer and adapted to adhesively attach a micro-device to be transferred to a target substrate thereto, the adhesive layer having a second elastic modulus smaller than the first elastic modulus, wherein the load control layer has a first zero-stiffness region in which a first stress is maintained in a first strain section ranging from a first strain to a second strain.

In one embodiment, the carrier film may further include: a displacement control layer interposed between the load control layer and the adhesive layer, the displacement control layer having a third elastic modulus greater than the first elastic modulus.

In one embodiment, the carrier film may further include: a reinforcing layer interposed between a base portion providing compressive force to the carrier film and the load control layer and to allow a second stress greater than the first stress to be maintained in the first strain section, the reinforcing layer having a fourth elastic modulus greater than the first elastic modulus.

In one embodiment, a starting strain of the first strain section may be adjusted depending on a thickness of the load control layer with the first stress maintained.

In one embodiment, the space in the load control layer may be formed in a porous shape.

In one embodiment, the space in the load control layer may be divided by partitions adapted to be folded when a load is applied thereto.

In one embodiment, the load control layer may include a plurality of unit load control layers separated from one another with a gap therebetween.

In one embodiment, the load control layer may include a first load control layer having a first strength and a second load control layer having a second strength smaller than the first strength, wherein the first load control layer may have a second zero-stiffness region in which a third stress is maintained in a second strain section ranging from a third strain to a fourth strain, and the second load control layer may have a third zero-stiffness region in which a fourth stress smaller than the third stress is maintained in the second strain section.

In one embodiment, the first load control layer and the second load control layer may be placed on the same plane to be adjacent to each other.

In one embodiment, the first load control layer and the second load control layer may be formed of different materials.

In one embodiment, the space in the load control layer may be formed such that the first load control layer has a first spatial density and the second load control layer has a second spatial density higher than the first spatial density.

In one embodiment, the load control layer may include a third load control layer having a third strength and a fourth load control layer having a fourth strength greater than the third strength, wherein the third load control layer may have a fourth zero-stiffness region in which a fifth stress is maintained in a third strain section ranging from a fifth strain to a sixth strain, and the fourth load control layer may have a fifth zero-stiffness region in which a sixth stress greater than the fifth stress is maintained in a fourth strain section ranging from a seventh strain greater than the sixth strain to an eighth strain.

In one embodiment, the fourth load control layer may be formed on the third load control layer.

In one embodiment, the third load control layer and the fourth load control layer may be formed of different materials.

In one embodiment, the space in the load control layer may be formed such that the third load control layer has a third spatial density and the fourth load control layer has a fourth spatial density lower than the third spatial density.

Advantageous Effects

According to one embodiment of the present invention, the carrier film for transferring micro-devices includes a load control layer having a zero-stiffness region in which a specific value of stress is maintained in a specific strain section, whereby uniform contact pressure can be applied to the micro-device even under varying displacement due to various error factors by providing an appropriate amount of pressing force to allow the carrier film to be deformed in the specific strain section.

That is, since an appropriate amount of contact pressure for transfer of the micro-device can be uniformly applied to the micro-device by performing control such that compressive force is applied to the load control layer to allow the load control layer to be compressively deformed in the specific strain section in which the load control layer has the zero-stiffness region, transfer of the micro-device can be achieved in a more stable and effective manner.

According to one embodiment of the present invention, the load control layer may include a plurality of unit load control layers separated from one another with a gap therebetween. Thus, when a first force is laterally applied to the unit load control layers upon application of pressure by a base portion, force applied to the adhesive layer can be smaller than the first force. As a result, lateral contact pressure applied to the micro-device, that is, tensile force applied to the micro-device, can be reduced, thereby effectively preventing damage to the micro-device.

According to one embodiment of the present invention, a displacement control layer harder than the load control layer is interposed between the load control layer and the adhesive layer. Accordingly, when a first force is laterally applied to the load control layer upon application of pressure by the base portion, force applied to the adhesive layer can be smaller than the first force, thereby effectively preventing damage to the micro-device.

According to one embodiment of the present invention, the load control layer may have a plurality of zero-stiffness regions in which different values of stress are maintained in the same strain section.

Accordingly, even when the first load control layer and the second load control layer are compressively deformed by the same amount of displacement by compressive force, a larger amount of contact pressure can be generated in a first region in which the first load control layer is disposed and a smaller amount of contact pressure can be generated in a second region in which the second load control layer is disposed. As a result, when the amount of contact pressure required for transfer of the micro-device is different at different points of the micro-device, transfer of the micro-device can be easily achieved using a corresponding one of the first and second load control layers.

According to one embodiment of the present invention, the load control layer may have a plurality of zero-stiffness regions in which different values of stress are maintained in different strain sections. Accordingly, contact pressure can be selectively generated in a third load control layer or a fourth load control layer through application of compressive force, whereby contact pressure can be applied to the micro-device by an appropriate one of the third and fourth load control layers depending on whether a smaller amount of contact pressure is required or a larger amount of contact pressure is required, thereby allowing transfer of the micro-device to be performed in various manners.

BEST MODE

Figure 1:
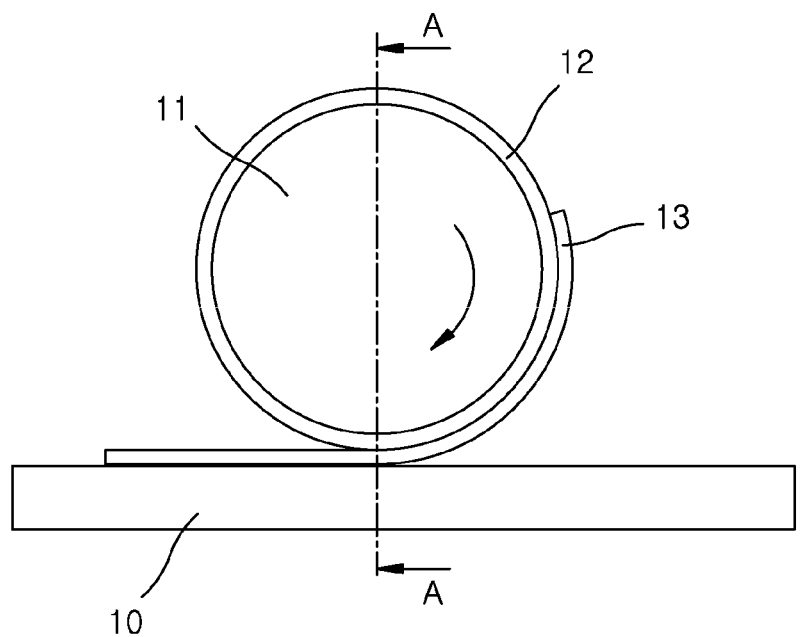
FIG. 1 is a schematic view of a typical roll-type transfer apparatus.
Figure 2:
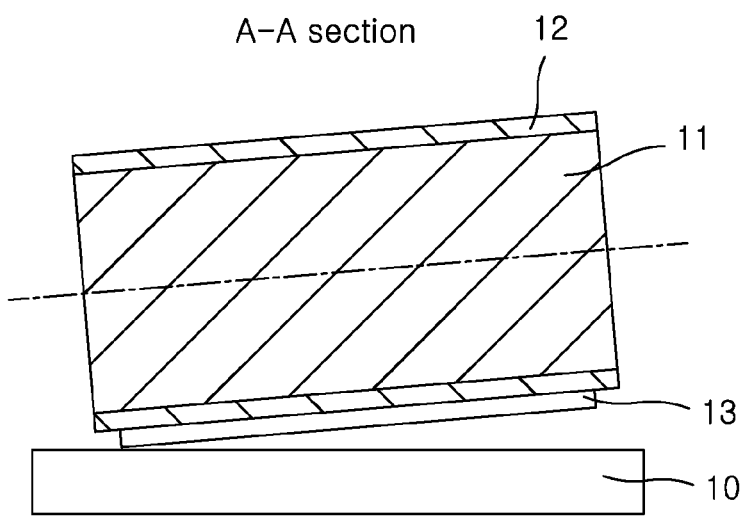
FIG. 2 is a sectional view taken along line A-A of FIG. 1.
Figure 3:
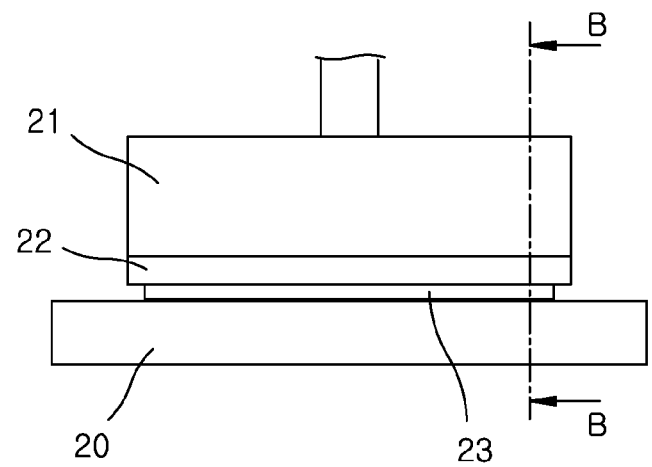
FIG. 3 is a schematic view of a typical plate-type transfer apparatus.
Figure 4:
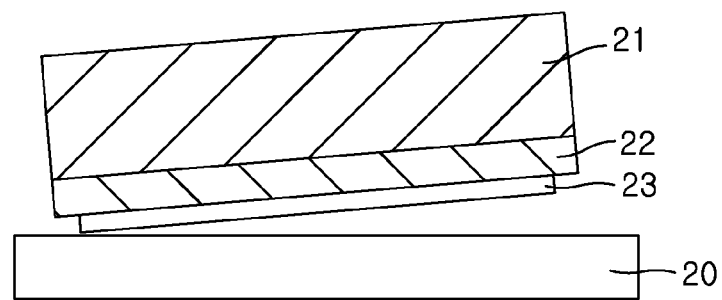
FIG. 4 is a sectional view taken along line B-B of FIG. 3.

Reference will now be made in detail to various embodiments, examples of which are illustrated in the accompanying drawings. It should be understood that the present invention may be embodied in different ways and is not limited to the following embodiments. In the drawings, portions irrelevant to the description will be omitted for clarity. Like components will be denoted by like reference numerals throughout the specification.

Throughout the specification, when an element or layer is referred to as being "on," "connected to," or "coupled to' another element or layer, it may be directly on, connected to, or coupled to the other element or layer or intervening elements or layers may be present. In addition, unless otherwise stated, the term "includes" should be interpreted as not excluding the presence of other components than those listed herein.

The terminology used herein is for the purpose of describing particular embodiments and is not intended to be limiting. As used herein, the singular forms, "a," and "an" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Hereinafter, embodiments of the present invention will be described in detail with reference to the accompanying drawings.

Figure 5:
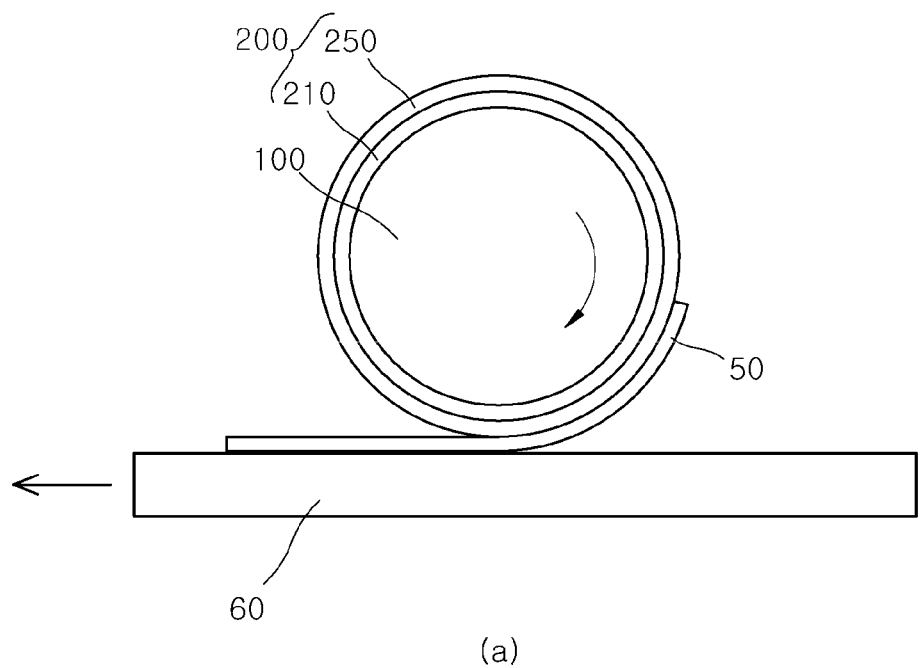
FIG. 5 is a schematic view of a transfer apparatus using a carrier film for transferring micro-devices according to a first embodiment of the present invention.
Figure 6:
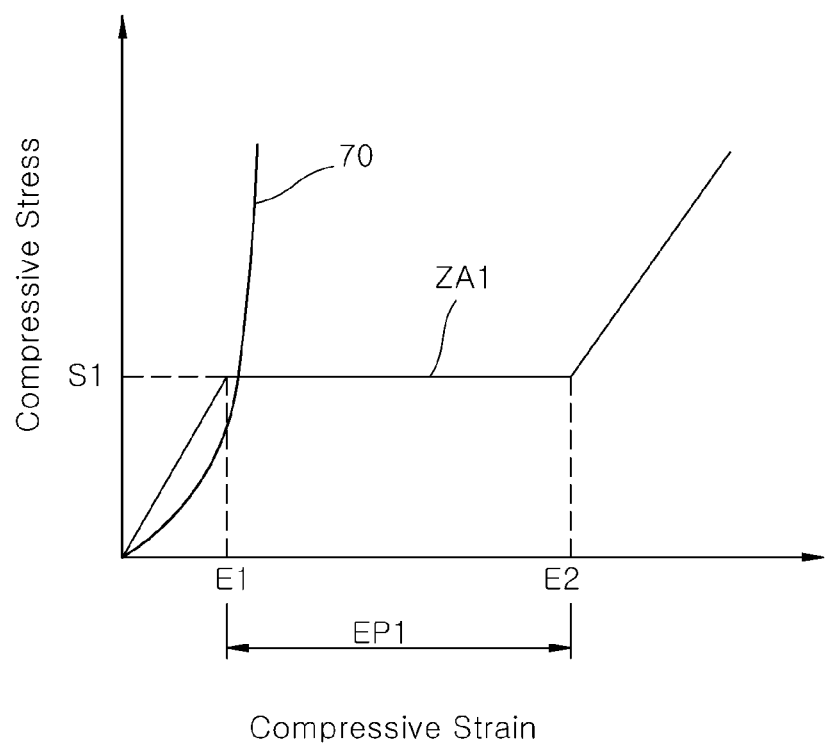
FIG. 6 is a graph illustrating a zero-stiffness region of a load control layer of the carrier film for transferring micro-devices according to the first embodiment.
Figure 7:
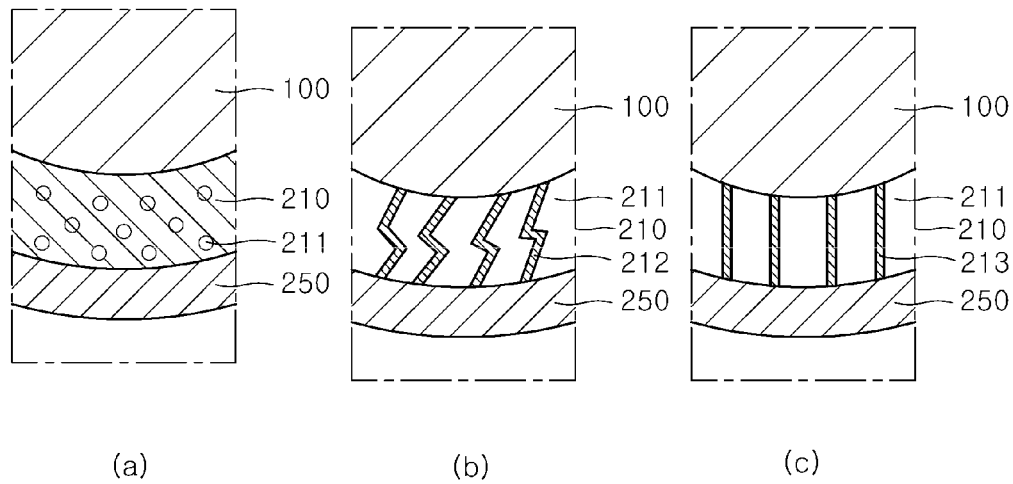
FIG. 7 is a schematic view of a space in the load control layer of the carrier film for transferring micro-devices according to the first embodiment.

FIG. 5 is a schematic view of a transfer apparatus using a carrier film for transferring micro-devices according to a first embodiment of the present invention, FIG. 6 is a graph illustrating a zero-stiffness region of a load control layer of the carrier film for transferring micro-devices according to the first embodiment, and FIG. 7 is a schematic view illustrating a space in the load control layer of the carrier film for transferring micro-devices according to the first embodiment.

Herein, a micro-device 50 may refer to any thin film device that has a microscale to nanoscale thickness. The micro-device having a microscale to nanoscale thickness may include graphene.

Referring to FIG. 5 to FIG. 7, a carrier film 200 for transferring micro-devices may include a load control layer 210 and an adhesive layer 250.

The load control layer 210 may have a first zero-stiffness region ZA1 in which a first stress S1 is maintained in a first strain section EP1 ranging from a first strain E1 to a second strain E2.

First, zero stiffness will be described.

In FIG. 6, the horizontal axis represents compressive strain and the vertical axis represents compressive stress. From the graph shown in FIG. 6, it is possible to find the value of compressive stress in a corresponding component during compressive deformation of the component caused by compressive force applied thereto.

When a corresponding component tightly interposed between two dissimilar components is pressed by one of the two components, the corresponding component is compressively deformed. When the compressive force continues to be applied to the corresponding component, the corresponding component continues to be compressively deformed, causing compressive stress to occur in the corresponding component. As the compressive stress increases, the compressive force applied to the corresponding component is transmitted to the other component tightly contacting the corresponding component.

When a micro-device 13 attached to an adhesive layer 12 is pressed by a roller 11 provided with only the adhesive layer 12 as in a typical thin film device transfer apparatus shown in FIG. 1, the adhesive layer 12 exhibits a stress-strain curve 70 in which compressive stress continues to increase with increasing compressive strain, as shown in FIG. 6. That is, when the adhesive layer 12 is pressed by the roller 11, the adhesive layer 12 is compressively deformed, causing increase in compressive stress. As compressive stress in the adhesive layer increases, compressive force applied by the roller 11 is transmitted to the micro-device 13 attached to the adhesive layer 12. In addition, in reaction to compressive stress in the adhesive layer 12, pressure corresponding in amount to the compressive stress is transmitted to the micro-device 13. In particular, referring to the stress-strain curve 70, since the compressive stress in the adhesive layer 12 sharply increases, contact pressure applied to the micro-device 13 also sharply increases, causing damage to the micro-device 13.

Conversely, referring to FIG. 5, the load control layer 210 according to the first embodiment may have the first zero-stiffness region ZA1 in which the first stress S1 is maintained in the first strain section EP1 ranging from the first strain E1 to the second strain E2.

That is, when external compressive force is applied to the load control layer 210, compressive stress in the load control layer 210 increases to the first stress S1 while the load control layer 210 is deformed to the first strain E1. However, in the first strain section EP1 ranging from the first strain E1 to the second strain E2, the compressive stress stops increasing and is maintained at the first stress S1. In other words, during compressive deformation of the load control layer 210 by compressive force applied thereto, compressive stress in the load control layer 210 does not increase in a specific compressive strain section, that is, the first strain section EP1.

This means that, when an appropriate amount of external compressive force is applied to the load control layer 210 to allow the load control layer to be deformed in the first strain section EP1, constant contact pressure can be applied to the micro-device 50.

Accordingly, even when the carrier film 200 for transferring micro-devices is not uniformly deformed due to machining errors of a component adapted to provide compressive force to the carrier film 200 for transferring micro-devices, such as a roller, thickness errors of the carrier film 200 for transferring micro-devices, assembly errors between various components including a roller and the like, and load control errors occurring in the process of controlling pressing force applied to the micro-device 50, uniform contact pressure can be applied to the micro-device 50 by providing an appropriate amount of pressing force to allow the load control layer 210 to be deformed in the first strain section EP1.

A base portion adapted to provide compressive force to the carrier film for transferring micro-devices may be a roller or a pressure plate. When the base portion is a roller, the micro-device transfer apparatus may be implemented as a roll-type transfer apparatus. When the base portion is a pressurized plate, the micro-device transfer apparatus may be implemented as a plate-type transfer apparatus. Hereinafter, for convenience, the present invention will be described based on an example in which the micro-device transfer apparatus is a roll-type transfer apparatus and the base portion is a roller.

Upon disposing the carrier film 200 for transferring micro-devices on the base portion 100, the load control layer 210 may be disposed on the base portion 100. The load control layer 210 may have a space 211 partially formed therein.

The space 211 in the load control layer 210 may be formed in a porous shape, as shown in FIG. 7(a).

Alternatively, the space 211 in the load control layer 210 may be divided by partitions 212 shaped to be easily folded when a load is applied thereto, as shown in FIG. 7(b). Alternatively, the space 211 in the load control layer 210 may be divided by partitions 213 shaped in a straight line and adapted to be foldable when a load is applied thereto, as shown in FIG. 7(c).

When compressive force is applied to the load control layer 210, the volume of the space in the load control layer 210 is reduced as the load control layer 210 is compressively deformed. As the space is gradually compressed from an initial volume, compression stress in the load control layer gradually increases. From a point in time at which the volume of the space is reduced to a specific value, that is, the first strain E1 is reached (compressive stress at this point is referred to as the first stress S1), compressive stress in the load control layer can be maintained at the first stress S1 even when the volume of the space gradually decreases and the load control layer 210 is compressively deformed. Further, from a point in time at which the volume of the space in the load control layer 210 is reduced to another specific value, that is, the second strain E2 is reached, as the load control layer 210 continues to be compressively deformed, compressive stress in the load control layer 210 increases again.

According to the first embodiment of the present invention, an appropriate amount of contact pressure for transfer of the micro-device 50 can be uniformly applied to the micro-device 50 by applying compressive force to the load control layer 210 through the base portion 100 such that the load control layer 210 is compressively deformed in the first strain section EP1, in which contact pressure applied to the micro-device 50 is low enough not to cause damage to the micro-device 50, thereby allowing transfer of the micro-device 50 to be achieved in a more stable and effective manner. Here, transfer of the micro-device 50 may include a picking step in which the micro-device 50 is peeled off of a source substrate and a placing step in which the micro-device 50 is placed on a target substrate.

Further, a starting strain of the first strain section EP1 may be adjusted depending on the thickness of the load control layer 210 with the first stress S1 maintained.

That is, the thickness of the load control layer 210 may be adjusted such that the starting strain of the first strain section EP1 is larger or smaller than the first strain E1 with the first stress S1 maintained in the first zero-stiffness region ZA1. Specifically, as the thickness of the load control layer 210 decreases, the starting strain of the first strain section EP1 may decrease to a value smaller than the first strain E1 with the first stress S1 maintained. That is, a critical strain of the first strain section EP1 may decrease. Further, as the thickness of the load control layer 210 increases, the starting strain of the first deformation section EP1 may increase to a value larger than the first strain E1. That is, the critical strain of the first deformation section EP1 may increase.

The load control layer 210 may be formed of at least one selected from the group of polydimethylsiloxane (PDMS), polyethylene, and polyurethane.

The adhesive layer 250 may be formed on the load control layer 210 and the micro-device 50 to be transferred to the target substrate 60 may be adhesively attached to the adhesive layer 250.

The load control layer 210 may have a first elastic modulus and the adhesive layer 250 may have a second elastic modulus smaller than the first elastic modulus. That is, the adhesive layer 250 may be softer than the load control layer 210.

The transfer apparatus according to the present invention may further include a base film (not shown) interposed between the carrier film 200 for transferring micro-devices and the base portion 100. The base film may have adhesiveness to provide adhesive force by which the carrier film 200 for transferring micro-devices is attached to the base portion 100. Upon separation of the carrier film 200 for transferring micro-devices from the base portion 100, the base film may be separated from the base portion 100 together with the carrier film 200 for transferring micro-devices. If the load control layer 210 is directly attached to the base portion 100, the load control layer 210 can be damaged due to adhesive force thereof upon separating the carrier film 200 for transferring micro-devices 200 from the base portion 100. According to the present invention, damage to the load control layer 210 can be prevented by further providing the base film.

When the base portion 100 is a roller, the base film serves to allow the carrier film 200 for transferring micro-devices to be mechanically attached to the base portion 100 therethrough. For example, when the base portion 100 is a roller having a pair of hooks adapted to hold respective opposite ends of the carrier film 200 tightly contacting an outer surface of the roller, the base film may be interposed between the carrier film 200 for transferring micro-devices and the base portion 100 to be coupled at opposite ends thereof to the pair of hooks, respectively, thereby allowing the carrier film 200 for transferring micro-devices to be mechanically attached to the base portion 100.

When the base portion 100 is a pressure plate adapted to attach the carrier film 200 for transferring micro-devices thereto by vacuum pressure, the base film may be interposed between the carrier film 200 for transferring micro-devices and the base portion 100 to allow effective application of vacuum pressure. That is, when the load control layer 210 does not have a flat surface, if the load control layer 210 is brought into direct contact with the pressure plate, it is difficult to create sufficient vacuum pressure. According to the present invention, it is possible to provide sufficient vacuum pressure to attach the carrier film 200 for transferring micro-devices by further providing the base film.

Figure 8:
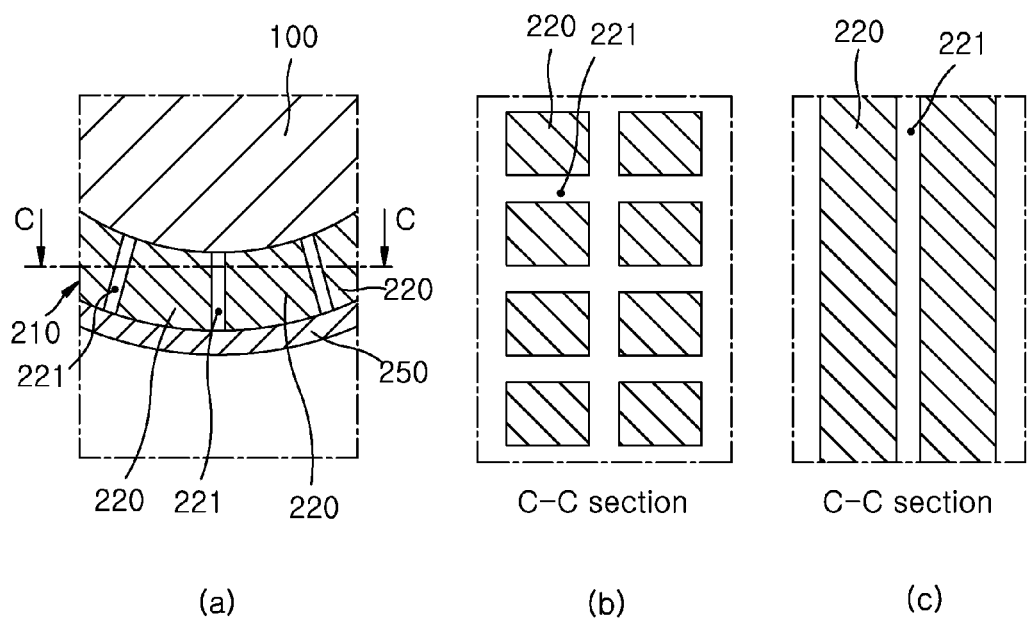
FIG. 8 is a schematic view mainly showing a carrier film for transferring micro-devices according to a second embodiment of the present invention.
Figure 9:
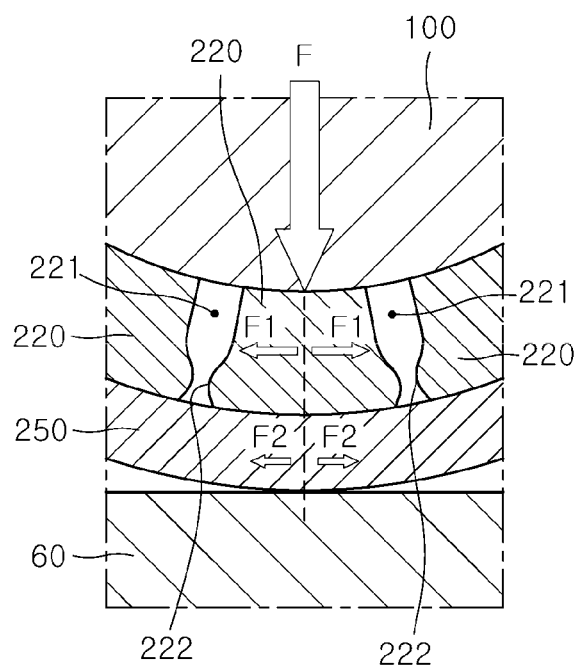
FIG. 9 is a schematic view illustrating operation of the carrier film for transferring micro-devices according to the second embodiment.

FIG. 8 is a schematic view mainly showing a carrier film for transferring micro-devices according to a second embodiment of the present invention and FIG. 9 is a schematic view illustrating operation of the carrier film for transferring micro-devices according to the second embodiment. Since the carrier film according to this embodiment is substantially the same as the carrier film according to the first embodiment except for the configuration of the load control layer, repeated description will be omitted and the same components as in the first embodiment will be denoted by the same reference numerals as in the first embodiment.

Referring to FIG. 8 and FIG. 9, the load control layer 210 may include a plurality of unit load control layers 220. The unit load control layers 220 may be separated from one another with gaps 221 therebetween.

When compressive force is applied to the unit load control layers 220 separated from one another, the unit load control layers 220 are reduced in height and increased in volume in lateral directions thereof while being compressively deformed. Each of the gaps 221 between the unit load control layers 220 provides a space to accommodate lateral protrusion of a portion 222 of a corresponding unit load control layer 220 upon compressive deformation of the unit load control layers 220.

Accordingly, when pressure F is applied by the base portion 100 such that a first force F1 acts on the unit load control layer 220 in a lateral direction thereof, a second force F2 smaller than the first force F1 can act on the adhesive layer 250. As a result, lateral contact pressure applied to the micro-device 50, that is, tensile force applied to the micro-device 50, can be reduced, thereby preventing damage to the micro-device 50.

The unit load control layers 220 may be formed in a grid pattern (see FIG. 8(b)) or in a stripe pattern (see FIG. 8(c)) on an outer surface of the base portion 100. However, it will be understood that the present invention is not limited thereto and the unit load control layers 220 may be formed in various other patterns so long as gaps 221 can be formed between the unit load control layers 220.

Figure 10:
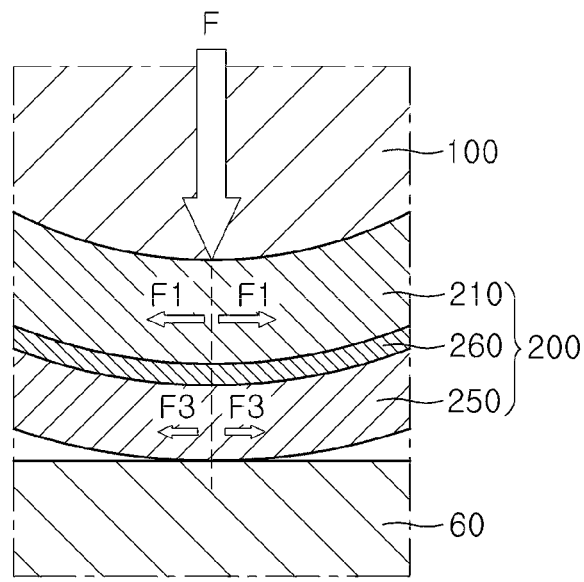
FIG. 10 is a schematic view of a carrier film for transferring micro-devices according to a third embodiment of the present invention.

FIG. 10 is a schematic view of a carrier film for transferring micro-devices according to a third embodiment of the present invention. Since the carrier film according to this embodiment is substantially the same as the carrier film according to the first embodiment except for a displacement control layer, repeated description will be omitted and the same components as in the first embodiment will be denoted by the same reference numerals as in the first embodiment.

Referring to FIG. 10, the carrier film 200 for transferring micro-devices according to the third embodiment may further include a displacement control layer 260. The displacement control layer 260 may be interposed between the load control layer 210 and the adhesive layer 250.

The displacement control layer 260 may have a third elastic modulus greater than the first elastic modulus of the load control layer 210. That is, the displacement control layer 260 may be harder than the load control layer 210.

Accordingly, when pressure F is applied by the base portion 100 such that a first force F1 acts on the load control layer 210 in a lateral direction thereof, a third force F3 smaller than the first force F1 can act on the adhesive layer 250 due to the presence of the displacement control layer 260 harder than the load control layer 210. As a result, lateral contact pressure applied to the micro-device 50 can be reduced, thereby effectively preventing damage to the micro-device 50.

The displacement control layer 260 may be formed of polyethylene terephthalate (PET).

Figure 11:
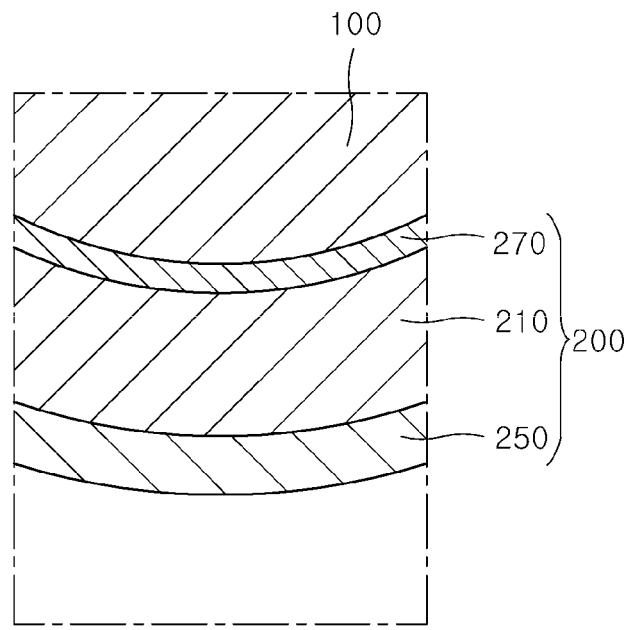
FIG. 11 is a schematic view of a carrier film for transferring micro-devices according to a fourth embodiment of the present invention.

FIG. 11 is a schematic view of a carrier film for transferring micro-devices according to a fourth embodiment of the present invention. Since the carrier film for transferring micro-devices according to this embodiment is substantially the same as the carrier film for transferring micro-devices according to the first embodiment except for further including a reinforcing layer, repeated description will be omitted and the same components as in the first embodiment will be denoted by the same reference numerals as in the first embodiment.

Referring to FIG. 11 together with FIG. 6, the carrier film 200 for transferring micro-devices according to the fourth embodiment of the present invention may further include a reinforcing layer 270. The reinforcing layer 270 may be interposed between the base portion 100 and the load control layer 210.

The reinforcing layer 270 may have a fourth elastic modulus greater than the first elastic modulus of the load control layer 210.

With the reinforcing layer 270 interposed between the base portion 100 and the load control layer 210, a second stress (not shown) greater than the first stress S1 can be maintained in the first strain section EP1 with respect to the first zero-stiffness region ZA1 of the load control layer 210 in the absence of the reinforcing layer 270. That is, a critical load (or critical stress) under which the first strain section EP1 starts can be increased.

Figure 12:
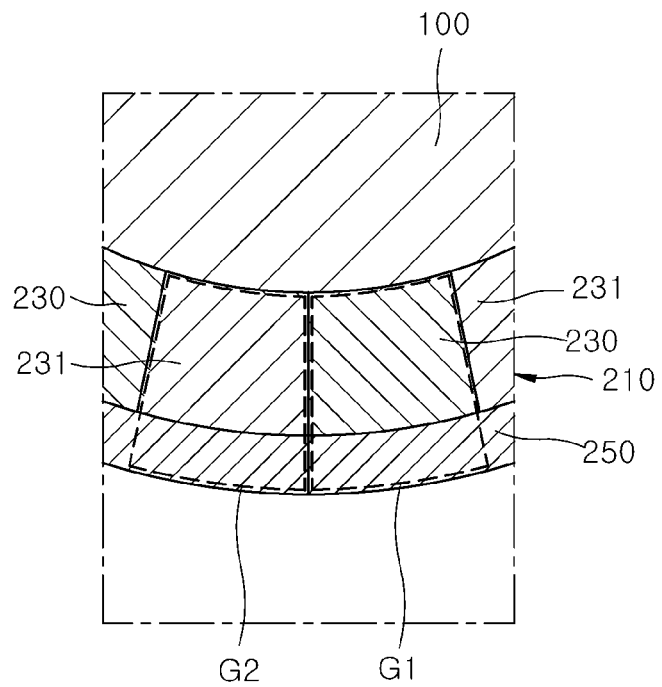
FIG. 12 is a schematic view of a carrier film for transferring micro-devices according to a fifth embodiment of the present invention.
Figure 13:
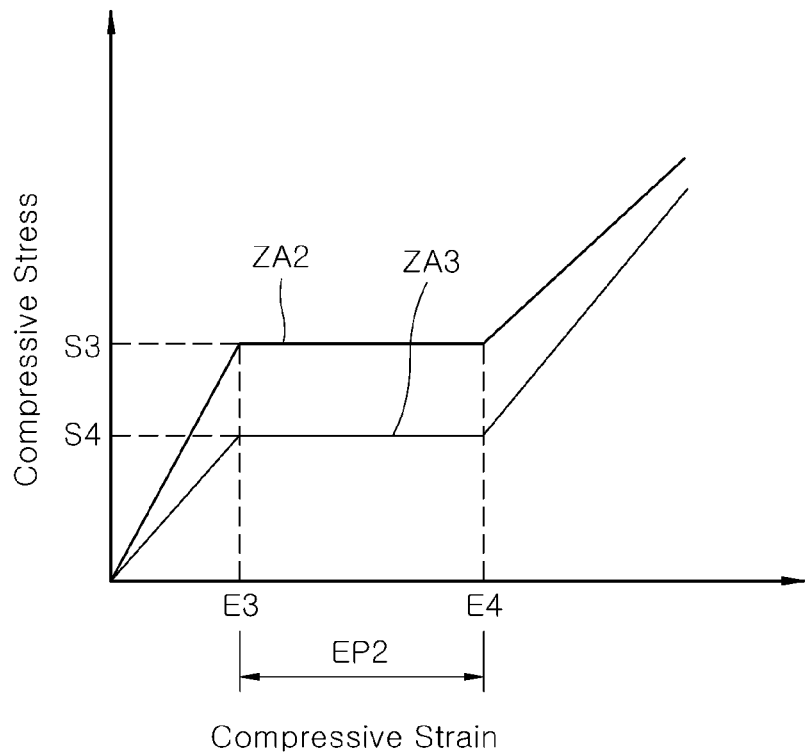
FIG. 13 is a graph illustrating a zero-stiffness region of a load control layer of the carrier film for transferring micro-devices according to the fifth embodiment.

FIG. 12 is a schematic view of a carrier film for transferring micro-devices according to a fifth embodiment of the present invention and FIG. 13 is a graph illustrating a zero-stiffness region of a load control layer of the carrier film for transferring micro-devices according to the fifth embodiment. Since the carrier film for transferring micro-devices according to this embodiment is substantially the same as the carrier film for transferring micro-devices according to the first embodiment except for the configuration of the load control layer, repeated description will be omitted and the same components as in the first embodiment will be denoted by the same reference numerals as in the first embodiment.

Referring to FIG. 12 and FIG. 13, the load control layer 210 may include a first load control layer 230 having a first strength and a second load control layer 231 having a second strength smaller than the first strength. To this end, the space in the load control layer may be formed such that the first load control layer 230 has a first spatial density and the second load control layer 231 has a second spatial density higher than the first spatial density. Alternatively, the first load control layer 230 and the second load control layer 231 may be formed of different materials.

Here, when the first load control layer 230 is formed in a porous shape, the first spatial density and the second spatial density may refer to pore density.

The first load control layer 230 may have a second zero-stiffness region ZA2 in which a third stress S3 is maintained in a second strain section EP2 ranging from a third strain E3 to a fourth strain E4.

The second load control layer 231 may have a third zero-stiffness region ZA3 in which a fourth stress S4 smaller than the third stress S3 is maintained in the second strain section EP2.

Here, the first load control layer 230 and the second load control layer 231 may be placed in the same plane on the base portion 100 to be adjacent to each other.

Accordingly, different amounts of contact pressure can be generated in a first region G1 including the first load control layer 230 and a second region G2 including the second load control layer 231.

That is, according to this embodiment, the carrier film for transferring micro-devices may have a plurality of zero-stiffness regions in which different values of compressive stress are maintained in the same strain section.

Accordingly, even when the first load control layer 230 and the second load control layer 231 are compressively deformed by the same amount of displacement by compressive force applied by the base portion 100, a larger amount of contact pressure can be generated in the first region G1 including the first load control layer 230 and a smaller amount of contact pressure can be generated in the second region G2 including the second load control layer 231.

The carrier film for transferring micro-devices according to this embodiment can be effectively used when the amount of contact pressure required to transfer the micro-device is different at different points of the micro-device upon peeling the micro-device off of a source substrate or transferring the micro-device to a target substrate.

Although the first load control layer 230 and the second load control layer 231 are shown as alternately formed in FIG. 12, it will be understood that the present invention is not limited thereto and the first load control layer 230 and the second load control layer 231 are disposed in other appropriate manners depending on the types of micro-devices to be transferred, the location of the micro-device, and the like.

Figure 14:
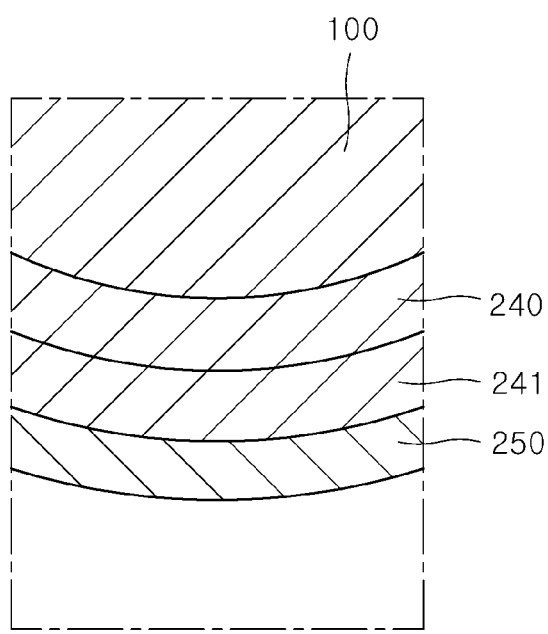
FIG. 14 is a schematic view of a carrier film for transferring micro-devices according to a sixth embodiment of the present invention.
Figure 15:
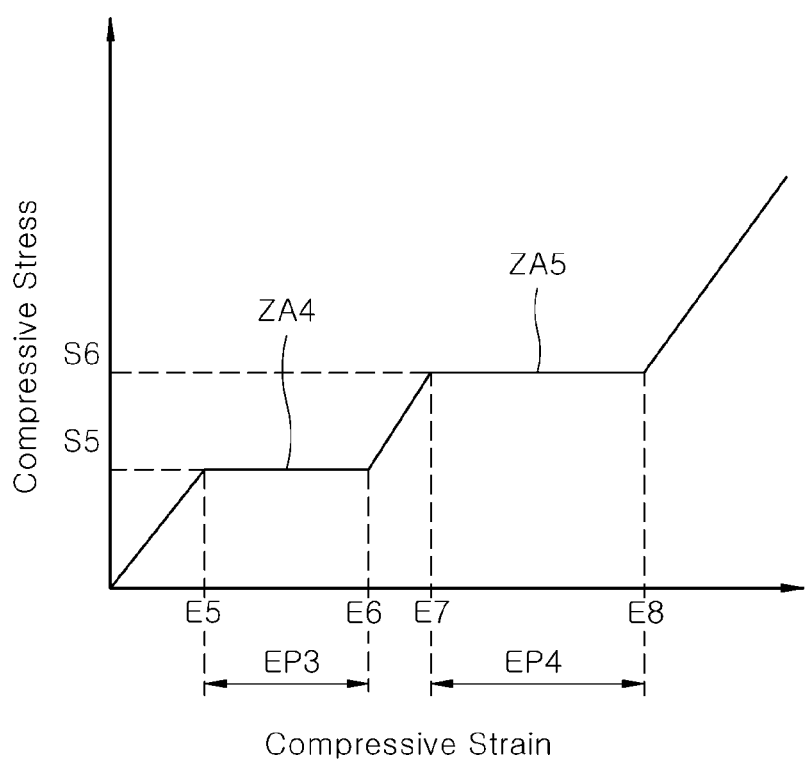
FIG. 15 is a graph illustrating a zero-stiffness region of a load control layer of the carrier film for transferring micro-devices according to the sixth embodiment.

FIG. 14 is a schematic view of a carrier film for transferring micro-devices according to a sixth embodiment of the present invention and FIG. 15 is a graph illustrating a zero-stiffness region of a load control layer of the carrier film for transferring micro-devices according to the sixth embodiment. Since the carrier film for transferring micro-devices according to this embodiment is substantially the same as the carrier film for transferring micro-devices according to the first embodiment except for the configuration of the load control layer, repeated description will be omitted and the same components as in the first embodiment will be denoted by the same reference numerals as in the first embodiment.

Referring to FIG. 14 and FIG. 15, the load control layer may include a third load control layer 240 having a third strength and a fourth load control layer 241 having a fourth strength greater than the third strength. To this end, the space in the load control layer may be formed such that the third load control layer 240 has a third spatial density and the fourth load control layer 241 has a fourth spatial density lower than the third space density. The third load control layer 240 and the fourth load control layer 241 may be formed of different materials.

The third load control layer 240 may have a fourth zero-stiffness region ZA4 in which a fifth stress S5 is maintained in a third strain section EP3 ranging from a fifth strain E5 to a sixth strain E6.

The fourth load control layer 241 may have a fifth zero-stiffness region ZA5 in which a sixth stress S6 is maintained in a fourth strain section EP4 ranging from a seventh strain E7 to an eighth strain E8. Here, the seventh strain E7 may be greater than the sixth strain E6 and the sixth stress S6 may be greater than the fifth stress S5.

The fourth load control layer 241 may be formed on the third load control layer 240. Upon disposing the carrier film for transferring micro-devices on the base portion 100, the third load control layer 240 may be disposed on the base portion 100.

According to this embodiment, the carrier film for transferring micro-devices may have a plurality of zero-stiffness regions in which different values of compressive stress are maintained in different strain sections, respectively.

Accordingly, contact pressure can be selectively generated in the third load control layer 240 or the fourth load control layer 241 by compressive force applied from the base portion 100. That is, when a relatively small amount of contact pressure is required, the third load control layer 240 may be compressively deformed to provide the fifth stress S5 having a relatively small value as the contact pressure. When a relatively large amount of contact pressure is required, the fourth load control layer 241 may be compressively deformed to provide the sixth stress S6 having a relatively large value as the contact pressure.

For example, in the picking process, which generally requires a relatively small amount of contact pressure, a relatively small amount of uniform contact pressure can be generated by providing compressive force to achieve compressive deformation in the third strain section EP3. In addition, in the placing process, which requires a relatively large amount of contact pressure, a relatively large amount of uniform contact pressure can be generated by providing compressive force to achieve compressive deformation in the fourth strain section EP4.

Although some embodiments have been described herein, it should be understood that these embodiments are provided for illustration only and are not to be construed in any way as limiting the present invention, and that various modifications, changes, alterations, and equivalent embodiments can be made by those skilled in the art without departing from the spirit and scope of the invention. For example, components described as implemented separately may also be implemented in combined form, and vice versa.

The scope of the present invention is indicated by the following claims and all changes or modifications derived from the meaning and scope of the claims and equivalents thereto should be construed as being included in the scope of the present invention.

List of reference numerals-

100: Base portion
200: Carrier film for transferring micro-devices
210: Load control layer
211: Space
212, 213: Partition
220: Unit load control layer
221: Gap
230: First load control layer
231: Second load control layer
240: Third load control layer
241: Fourth load control layer
250: Adhesive layer
260: Displacement control layer
270: Reinforcing layer

The invention claimed is:

1. A carrier film for transferring micro-devices, comprising:
a load control layer having a first elastic modulus and having a space partially formed therein; and
an adhesive layer formed on the load control layer and adapted to adhesively attach a micro-device to be transferred to a target substrate thereto, the adhesive layer having a second elastic modulus smaller than the first elastic modulus,
wherein the load control layer has a first zero-stiffness region in which a first stress is maintained in a first strain section ranging from a first strain to a second strain,
wherein the load control layer comprises a plurality of unit load control layers separated from one another with a gap therebetween.

2. The carrier film according to claim 1, further comprising:
a displacement control layer interposed between the load control layer and the adhesive layer,
the displacement control layer having a third elastic modulus greater than the first elastic modulus.

3. The carrier film according to claim 1, further comprising:
a reinforcing layer interposed between a base portion providing compressive force to the carrier film and the load control layer to allow a second stress greater than the first stress to be maintained in the first strain section,
the reinforcing layer having a fourth elastic modulus greater than the first elastic modulus.

4. The carrier film according to claim 1, wherein a starting strain of the first strain section is adjusted depending on a thickness of the load control layer with the first stress maintained.

5. The carrier film according to claim 1, wherein the space in the load control layer is formed in a porous shape.

6. The carrier film according to claim 1, wherein the space in the load control layer is divided by partitions adapted to be folded when a load is applied thereto.

7. A carrier film for transferring micro-devices, comprising:
a load control layer having a first elastic modulus and having a space partially formed therein; and
an adhesive layer formed on the load control layer and adapted to adhesively attach a micro-device to be transferred to a target substrate thereto, the adhesive layer having a second elastic modulus smaller than the first elastic modulus,
wherein the load control layer has a first zero-stiffness region in which a first stress is maintained in a first strain section ranging from a first strain to a second strain,
wherein the load control layer comprises a first load control layer having a first strength and a second load control layer having a second strength smaller than the first strength,
the first load control layer having a second zero-stiffness region in which a third stress is maintained in a second strain section ranging from a third strain to a fourth strain,
the second load control layer having a third zero-stiffness region in which a fourth stress smaller than the third stress is maintained in the second strain section.

8. The carrier film according to claim 7, wherein the first load control layer and the second load control layer are placed on the same plane to be adjacent to each other.

9. The carrier film according to claim 7, wherein the first load control layer and the second load control layer are formed of different materials.

10. The carrier film according to claim 7, wherein the space in the load control layer is formed such that the first load control layer has a first spatial density and the second load control layer has a second spatial density higher than the first spatial density.

11. A carrier film for transferring micro-devices, comprising:
a load control layer having a first elastic modulus and having a space partially formed therein; and
an adhesive layer formed on the load control layer and adapted to adhesively attach a micro-device to be transferred to a target substrate thereto, the adhesive layer having a second elastic modulus smaller than the first elastic modulus,
wherein the load control layer has a first zero-stiffness region in which a first stress is maintained in a first strain section ranging from a first strain to a second strain,
wherein the load control layer comprises a third load control layer having a third strength and a fourth load control layer having a fourth strength greater than the third strength,
the third load control layer having a fourth zero-stiffness region in which a fifth stress is maintained in a third strain section ranging from a fifth strain to a sixth strain,
the fourth load control layer having a fifth zero-stiffness region in which a sixth stress greater than the fifth stress is maintained in a fourth strain section ranging from a seventh strain greater than the sixth strain to an eighth strain.

12. The carrier film according to claim 11, wherein the fourth load control layer is formed on the third load control layer.

13. The carrier film according to claim 11, wherein the third load control layer and the fourth load control layer are formed of different materials.

14. He carrier film according to claim 11, wherein the space in the load control layer is formed such that the third load control layer has a third spatial density and the fourth load control layer has a fourth spatial density lower than the third spatial density.

* * * * *